United States Patent
Blanchard et al.

(10) Patent No.: US 7,557,394 B2
(45) Date of Patent: Jul. 7, 2009

(54) HIGH-VOLTAGE TRANSISTOR FABRICATION WITH TRENCH ETCHING TECHNIQUE

(75) Inventors: Richard A. Blanchard, Los Altos, CA (US); Françoise Hébert, San Mateo, CA (US)

(73) Assignee: Bourns, Inc., Riverside, CA (US)

( * ) Notice: Subject to any disclaimer, the term of this patent is extended or adjusted under 35 U.S.C. 154(b) by 287 days.

(21) Appl. No.: 11/270,313

(22) Filed: Nov. 9, 2005

(65) Prior Publication Data

US 2006/0261407 A1    Nov. 23, 2006

Related U.S. Application Data

(60) Provisional application No. 60/626,374, filed on Nov. 9, 2004.

(51) Int. Cl.
*H01L 29/772* (2006.01)
*H01L 29/78* (2006.01)

(52) U.S. Cl. .............. 257/287; 257/401; 257/409; 257/E29.006; 257/E29.028; 257/E29.04

(58) Field of Classification Search ............. 257/288, 257/356, 287, 401, 409, E29.006, E29.028, 257/E29.04
See application file for complete search history.

(56) References Cited

U.S. PATENT DOCUMENTS

| 3,555,374 | A | * | 1/1971 | Usuda ............... 257/356 |
| 4,393,391 | A | * | 7/1983 | Blanchard ............ 257/343 |
| 5,804,863 | A | * | 9/1998 | Rhee ................. 257/401 |
| 5,932,911 | A | * | 8/1999 | Yue et al. ............ 257/330 |

* cited by examiner

*Primary Examiner*—Evan Pert
(74) *Attorney, Agent, or Firm*—Lument Patent Firm

(57) ABSTRACT

A lateral high-voltage depletion-mode device structure in which fingers of semiconductor material are interdigitated with trench gates. Since the effective channel area is proportional to the depth of the trenches, a large amount of active channel area can be achieved for a given surface area.

30 Claims, 6 Drawing Sheets

HIGH-VOLTAGE TRANSISTOR FABRICATION WITH TRENCH ETCHING TECHNIQUE

CROSS-REFERENCE TO RELATED APPLICATIONS

This application claims priority from U.S. provisional patent application 60/626,374 filed on Nov. 9, 2004, which is hereby incorporated by reference.

BACKGROUND AND SUMMARY OF THE INVENTIONS

The present application relates to semiconductor devices, and more particularly to devices which are capable of switching relatively high voltages, e.g. of 50V or more, while remaining reasonably compatible with integrated circuit fabrication techniques.

Many power devices are designed as vertical devices, where the direction of carrier flow is into the semiconductor material (normal to the surface of the wafer). However, there are many advantages to "lateral" power devices, i.e. to transistors which have their direction of carrier flow approximately parallel to the surface. One outstanding attraction of lateral devices is process compatibility, since lateral devices can usually be fabricated with process steps which are the similar to or at least compatible with those used for low-voltage devices. Another attraction is that lateral devices tend to be somewhat easier to integrate with low-voltage devices, to provide "smart power" or "integrated power" functionality.

However, MOSFET and JFET structures that are manufactured with their channel regions at the top surface of the die have the amount of active channel limited by the surface area of the die. This limits the current-carrying capability available for a given footprint or cost.

High-Voltage Transistor Fabrication with Trench Etching Technique

The present application describes structures and methods for significantly increasing the amount of active channel that can be obtained for a lateral power device in a given area. This is done by using trenches to form sidewall-gated JFETs and/or depletion mode MOSFETs. Although the direction of current flow is lateral, the effective active channel now extends into the die as deeply as the trench etch permits.

The disclosed innovations, in various embodiments, provide one or more of at least the following advantages:

On-resistance can be reduced for a given footprint.
The total current-switching capability for a given footprint can be increased.
The total current-switching capability for a single die can be increased.
The heat dissipation for a given process flow and footprint can be decreased.
By addition of a deep trench etch, an integrated power process can obtain high current-switching capability.
Depletion-mode device fabrication is particularly easy.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment (by way of example, and not of limitation).

The present application describes techniques for significantly increasing the amount of active channel that can be obtained on a die through the use of trench technology for JFETs and depletion mode MOSFETs. An earlier U.S. Pat. No. 4,393,391, describes the manufacture of enhancement mode power MOS transistors, including DMOS transistors that have the amount of active channel area increased through the use of grooves having various geometries. The present invention disclosure differs considerably from the devices described in this earlier patent, as will be described below.

Figure 1A:
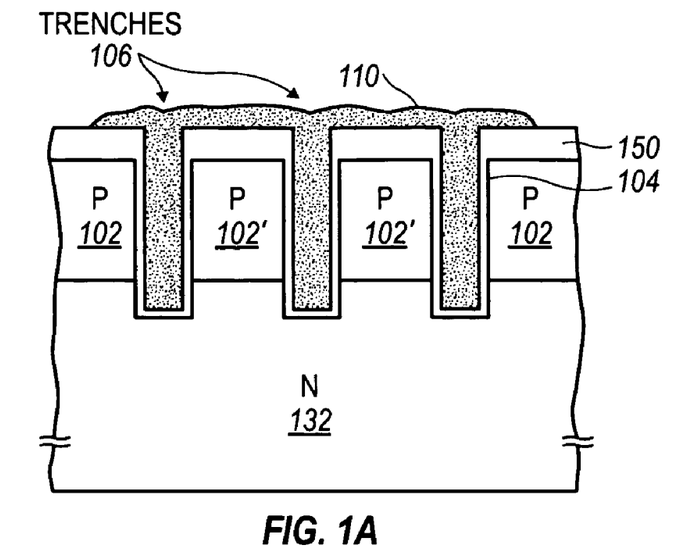
FIGS. 1a and 1b show a depletion mode MOSFET fabricated using an epitaxial layer.
Figure 1B:
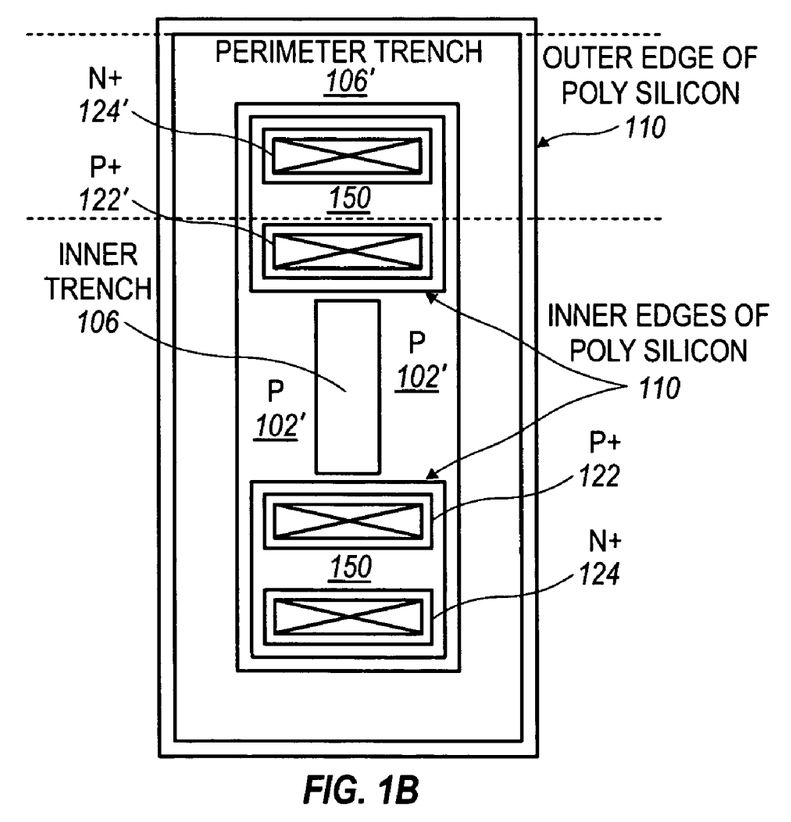

Depletion mode MOSFETs have a channel region present when no gate-to-source voltage is applied. Applying a voltage of the appropriate polarity to the gate decreases the conductivity of the channel. The amount of current that the device conducts can be reduced to a very low value when the voltage applied to the gate reaches the "pinch off" voltage "Vp" of the device. A p-channel depletion mode MOSFET fabricated using a p-type layer of epitaxial semiconductor on an n-type region of semiconductor is shown in FIGS. 1a and 1b. The cross-section of the device as seen in FIG. 1a shows the structure of the device. The two center p-type regions 102' of epitaxial semiconductor 102 form the channel of the device. The number of separate p-type regions 102' that contribute to the conduction may be as few as one, or as many as are required to provide the needed on-resistance or current. The conductive regions 102' are formed by etching trenches 106 into the surface of semiconductor that had been coated with a material 150 such as silicon dioxide, silicon nitride, or a sandwich of these materials using conventional photomasking and etching techniques. (The trenches can be etched as deeply as process technology permits; for example, a 10 micron deep trench will add 20 microns of equivalent channel width.)

After the trench etch step and one or more oxide growth and etch steps, a layer of gate dielectric 104 is formed (e.g. as a thin grown oxide), and a layer 110 of polycrystalline silicon (poly silicon) is deposited. The poly silicon 110 fills the trenches 106 and coats the surface of the semiconductor prior to being masked and etched to form the structure shown in FIG. 1a. By selecting the right combination of p-type dopant concentration in the epitaxial layer 102, trench-to-trench spacing, and gate dielectric composition and thickness, the channel region can be depleted of carriers, pinching the channel "off".

A top view of this structure is shown in FIG. 1b. Each of the two conducting p-type regions 102' is located between two trenches 106. (However, not every trench is located between two channel fingers: perimeter trenches 106' are not.) The polysilicon 110 extends across the entire device except for two rectangular regions at each end of the structure, which each contain a P+ region 122 and an N+ region 124. The P+ regions 122 at each end of the structure form low resistance contacts to the p-type semiconductor. The N+ regions 124 at each end of the structure form gate-to-source and gate-to-drain diodes that limit the voltage that can be applied to the gate 110, thereby preventing the gate dielectric 104 from being compromised by an over-voltage condition. The n-type silicon region 132 beneath the p-type epitaxial layer may be contacted, if necessary, by forming a contact on the back of the die, or by extending the n-type diffusion 124 from the top surface of the device to the depth of the n-type region 132.

In the example shown, the P+ source region 122 has a different reference numeral from the P+ drain region 122', but the sample embodiment shown is symmetric, so the connection of either end to source or drain is arbitrary. (However, this is not necessarily true of all embodiments.) Similarly, the example shown has gate clamp diode diffusion 124' at the drain end, as well as the gate clamp diode diffusion 124 at the source end, but this too is not strictly necessary.

The N+ region 124 provides the bias on the equivalent of the back gate of the device. In most instances, it will be at the source potential to avoid the need for another lead and voltage. In some instances, one might modulate the channel region with this gate as well.

In various sample embodiments, process parameters can have the following exemplary ranges:

Epitaxial layer doping can be e.g. from 5E13 (i.e. $5 \times 10^{13}$) to 5E15 $cm^{-3}$.

Pinch-off voltage can be from 3V to 500V (with breakdown correspondingly ranging from 5V to 800V).

The voltage-withstand region's width can be from 1 to 20 microns.

The distance from source to drain distance can be from 5 to 200 microns.

The high voltage device will have the lowest doping level, and the longest and widest channel. Pinch off is determined by the channel width, and can be set within a range by patterning dimensions.

In low-voltage embodiments, the epitaxial layer doping can be made higher than the above range, e.g. optionally as high as 1E17 $cm^{-3}$.

Figure 2A:
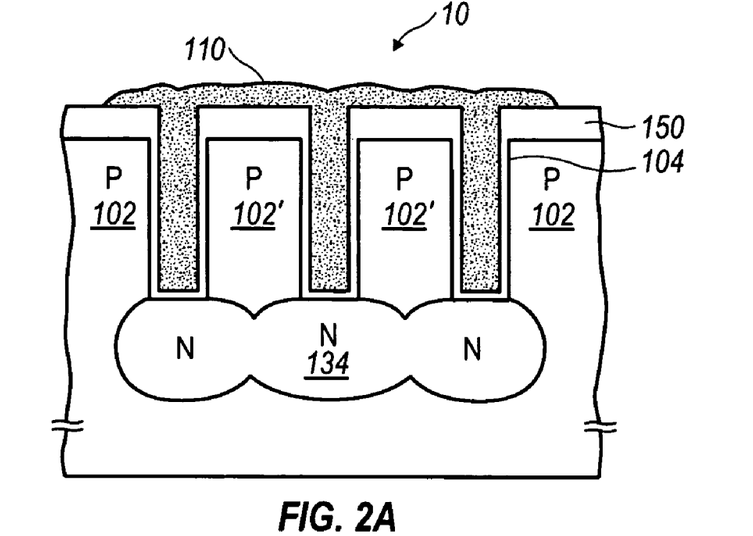
FIGS. 2a and 2b show a depletion mode MOSFET fabricated in a non-epitaxial wafer with implanted and diffused dopant isolating the channel.
Figure 2B:
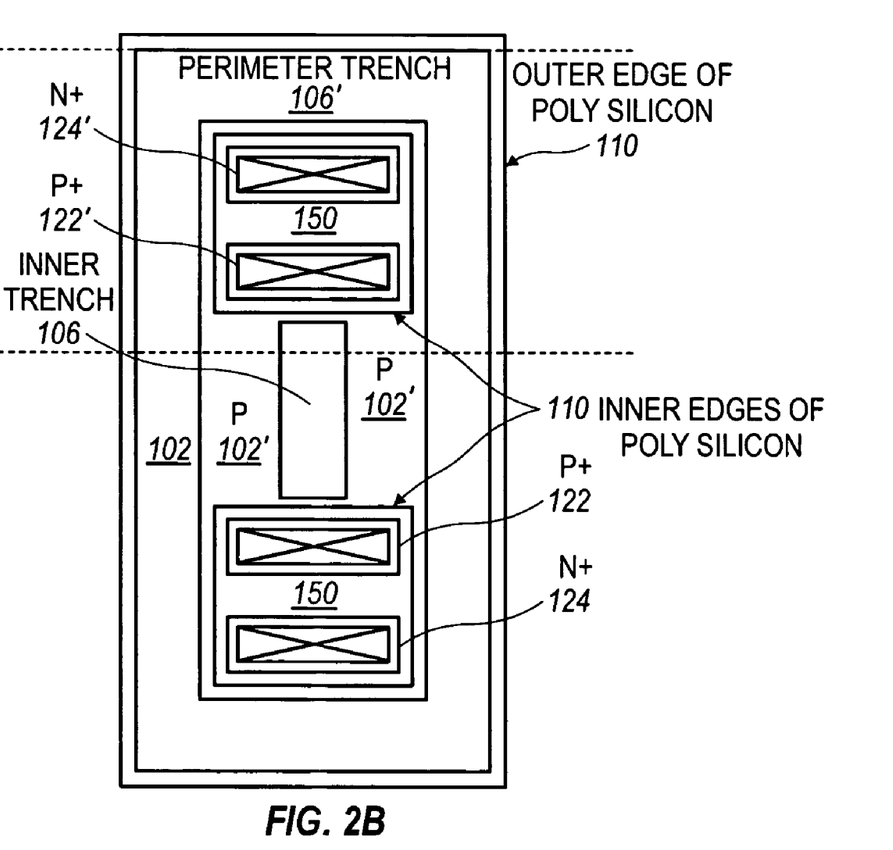

FIGS. 2a and 2b show a depletion mode MOSFET fabricated in a wafer without requiring an epitaxial layer (nor buried layer, nor any other type of deep junction or barrier structure). An n-type ion implantation step is performed through the dielectric layer at the bottom of the trench before the poly silicon is deposited. After the n-type dopant is diffused, the regions of n-type dopant that were originally separated will merge as shown in FIG. 2a, forming a continuous n-type region 134 at the bottom of the p-type regions 102' that form the channel. This n-type region substitutes for the n-type epitaxial layer present in FIG. 1.

A top view of the device of FIG. 2a is shown in FIG. 2b. Each of the two conducting p-type regions 102' is located between two trenches 106. The polysilicon 110 extends across the entire device except for the two rectangular regions at each end of the structure that each contains a P+ region 122 and an N+ region 124. The P+ regions 122, 122' at each end of the structure form low resistance contacts to the p-type semiconductor 102'. The N+ regions 124, 124' at each end of the structure form gate-to-source and gate-to-drain diodes that limit the voltage that can be applied to the gate 110, thereby preventing the gate dielectric 104 from being compromised by an over-voltage condition.

Figure 3A:
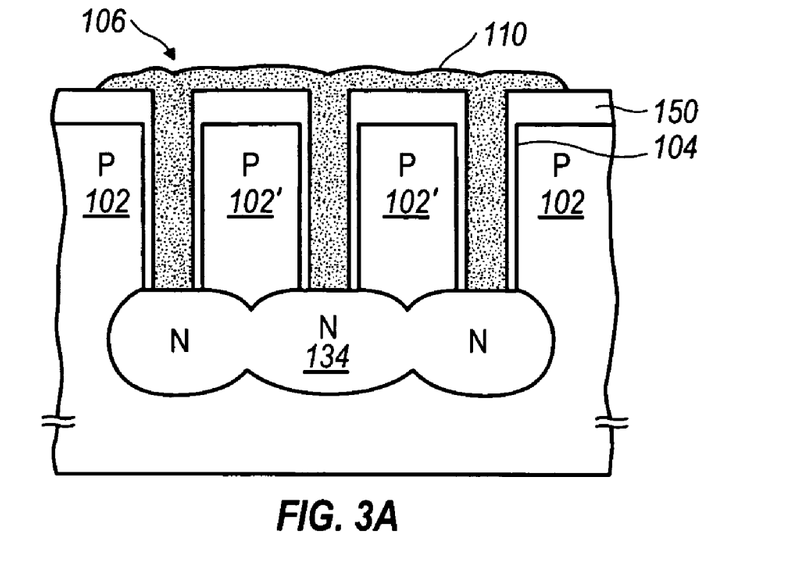
FIGS. 3a and 3b show a depletion mode MOSFET fabricated in a non-epitaxial wafer with dopant from the gate isolating the channel.
Figure 3B:
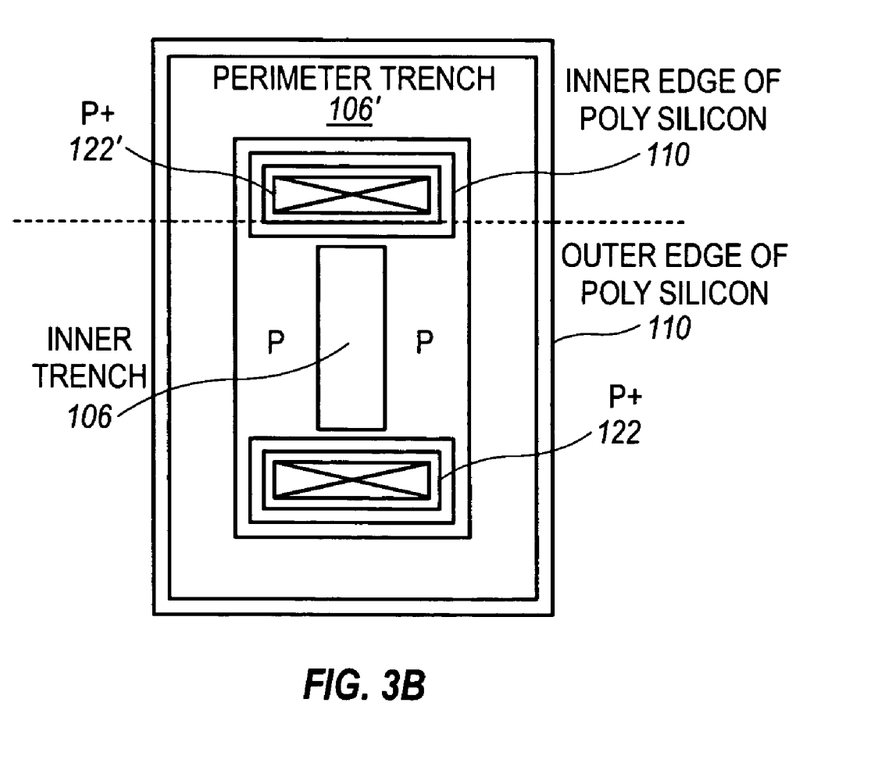

FIGS. 3a and 3b show another depletion mode MOSFET fabricated in a wafer without requiring an epitaxial layer. In this structure, the dielectric layer 104 is removed from the bottom of the trenches before the polysilicon 110 is deposited. N-type dopant from the gate 110 is diffused into the p-type wafer 102 until it overlaps below the conducting p-type regions 102' as shown in FIG. 3a. This structure is useful when the gate 110 needs to be connected to the n-type side of a diode to the source or drain regions.

A top view of the device of FIG. 3a is shown in FIG. 3b. Each of the two conducting p-type regions 102' is located between two trenches 106. The polysilicon 110 extends across the entire device except for the two rectangular regions at each end of the structure, which each contain a P+ region 122 and an N+ region 124. The P+ regions 122 at each end of the structure form low resistance contacts to the p-type semiconductor.

The structure of FIG. 3 will have a higher gate capacitance than that of FIG. 2. However, if the p-type silicon is lightly doped, the additional capacitance may be tolerable for applications where the device does not need to switch rapidly. An important advantage of the FIG. 3 structure (and similar structures) is that one less contact is required on the surface.

However, a further alternative embodiment uses a single, wider trench, in addition to the trenches of FIG. 2a, whose sole purpose is to contact the n-type regions 134 at the bottom of the body/channel region. It is made by etching a wider trench. Following an anisotropic poly etch, there is poly 110 on the sides of this wider trench, but it is not completely filled by the poly. After etching the oxide from the bottom of the trench where it is not covered by poly, another poly deposition can be performed using n-doped poly, forming a doped region that that is in contact with the n-doped poly in the trench.

Figure 4A:
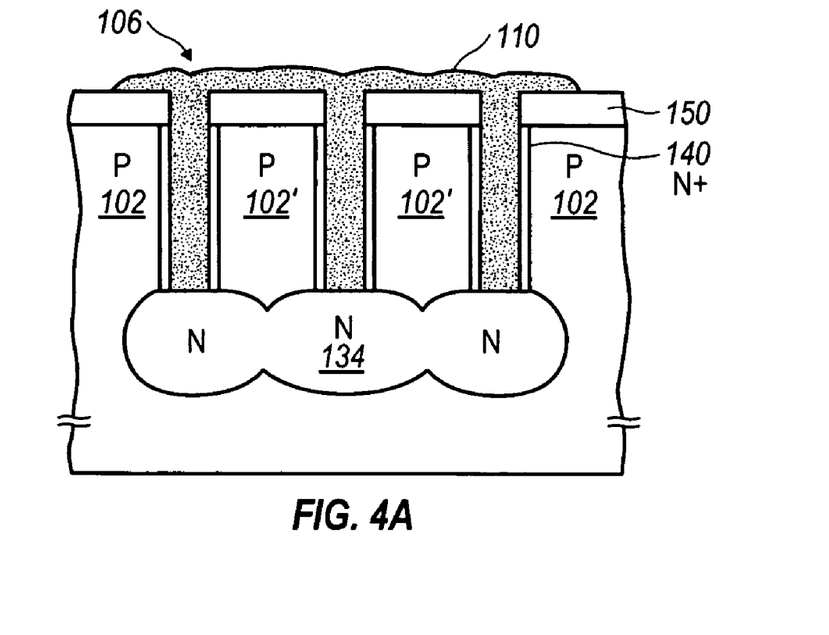
FIGS. 4a and 4b show a JFET fabricated in a non-epitaxial wafer with dopant from the gate isolating the channel.
Figure 4B:
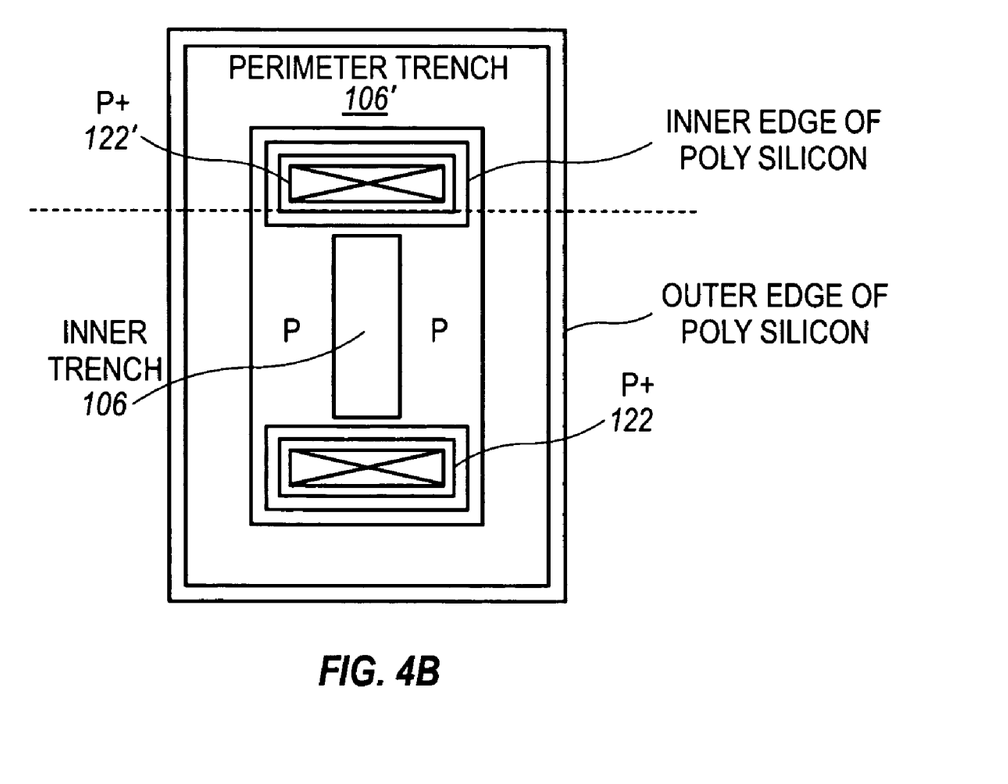

A JFET, which is a depletion mode device, may also be fabricated using the trench structure as shown in FIGS. 4a and 4b. As in the MOSFET structure in FIGS. 3a/3b, an n-type implant is performed in just the bottom of the trench, and serves as the source of the dopant that diffuses to form a continuous n-type region 134 at the bottom of the p-type regions 102' that form the channel. The n-type dopant that forms the gate 140 of the JFET may be implanted, it may be deposited from a solid source such as a doped oxide or from a gas source, or it may diffuse from the n-doped polysilicon 110 that forms the gate conductor. The p-type regions 102' between the polysilicon filled trenches conduct current between the source 122 and the drain 122' of the JFET. A positive bias on the n-type gate region 110 depletes carriers from the channel, decreasing the conductivity of the JFET.

Figure 5:
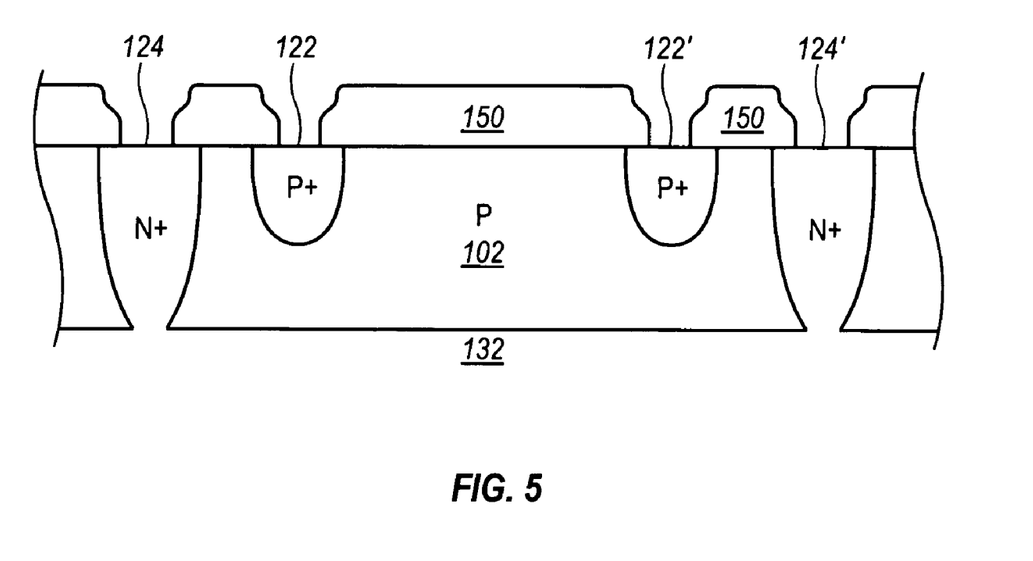
FIG. 5 shows a section through the length of the channel, in embodiments which include clamp diode contacts at both ends of the lateral device.

FIG. 5 shows a section through the length of the channel, in embodiments which include clamp diode contacts at both ends. Note that the N+ is a deep diffusion.

In some embodiments the pinch-off voltage of individual channels is varied. This is done, in the presently preferred embodiment, by varying the patterned width of channel fingers 102'. Preferably a variation in the neighborhood of +/−25% is used, but optionally this patterned variation can be as small as +/−10%. (A few percent of in-wafer variation in minimum width is likely to occur from patterning artifacts anyway, but this class of embodiments teaches that more variation should be deliberately introduced into the patterning.) However, in alternative embodiments, a variety of other techniques can be used to vary the individual pinch-off voltages. For example, the sidewall dielectric thickness can be varied, and/or a varied degree of trench sidewall etchback can be performed, and/or a dopant source can be deposited into some but not all gate trenches, and/or a patterned deposition can be used to shift the work function of the sidewall gate material in some locations.

Figure 6:
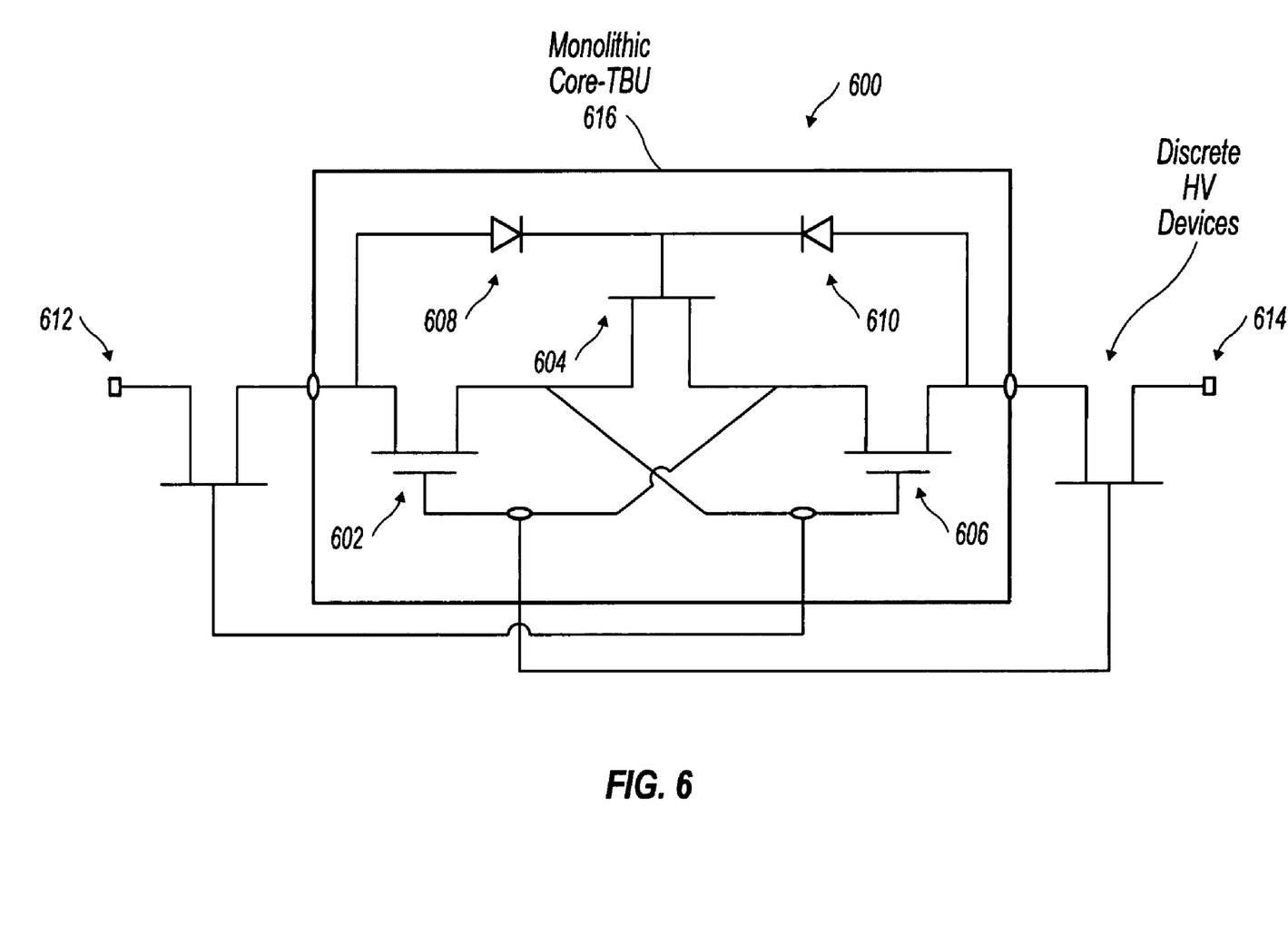
FIG. 6 shows an example of a circuit which can use a P-channel depletion device, implemented e.g. with the device structure shown in FIGS. 1a/b, 2a/b, 3a/b, and/or 4a/b.

FIG. 6 shows an example of a circuit which can use a P-channel depletion device as described above. This figure shows just one example of a transient blocking unit, but many others are also described extensively in other patent filings of Fultec Semiconductors. (See e.g. U.S. Pat. No. 5,742,463, US published application US2005128669, and published PCT applications WO2005020402, WO2004034544, WO03069753, and WO2004006408; all of these are hereby incorporated by reference.) FIG. 6 shows the monolithic core TBU 616 with a PJFET 604 (e.g. like that in FIG. 4*a*) and two NMOS devices 602, 606. Discrete high voltage devices 612, 614 are also shown as discrete additions to the integrated core TBU. The PJFET 604 provides the voltage drop necessary to turn off the NMOS devices 602, 606. The maximum voltage requirements are set by the pinch-off voltage of the high voltage (HV) input device or devices.

Figure 7:
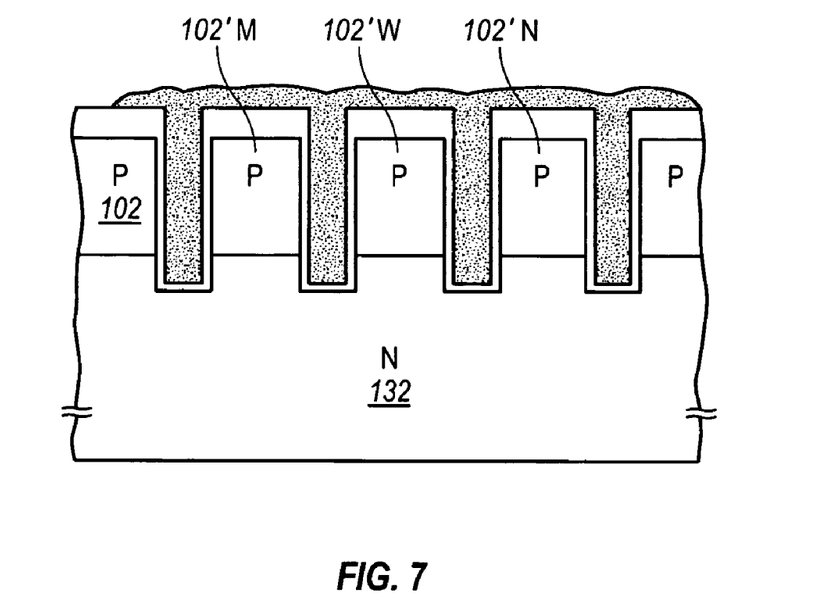
FIG. 7 shows a modification of the device of FIG. 1a, in which the channel fingers have different widths.

FIG. 7 shows a modification of the sectional view of FIG. 1*a*. In this Figure multiple channel fingers 102' are shown, but all three have different widths: channel finger 102'N is narrowest, 102'W is widest, and 102'M is intermediate. Since the three fingers are fabricated with the same steps, the spread of depletion regions from gate electrode will pinch off the different channel regions at different gate voltages. Thus when the gate voltage rises to turn off the device (which in this example is p-channel), the depletion regions due to the applied gate potential will pinch off channel finger 120'N first, then 120'M, then 102'W.

According to a disclosed class of innovative embodiments, there is provided: A transistor device, which includes: at least one semiconductor channel region bordered on two sides by trenches each having a gate electrode therein, and electrically isolated at the bottom thereof, between said trenches; said channel region running between a source and a drain; wherein the voltage of said gate controls current flow between said source and drain.

According to a disclosed class of innovative embodiments, there is provided: A transistor device, which includes: at least one semiconductor channel region bordered on two sides by trenches each having a gate electrode therein, and electrically isolated at the bottom thereof, between said trenches; said channel region running between a source and a drain; and a clamp diode which limits the voltage difference between said gate and said source; wherein the voltage of said gate controls current flow between said source and drain.

According to a disclosed class of innovative embodiments, there is provided: A lateral transistor device, comprising: a semiconductor channel region which is bordered on two sides by trenches each having a gate electrode therein, and which is electrically isolated at the bottom thereof by a buried diffusion which extends from the bottoms of said trenches, and which runs between first-conductivity-type source and drain diffusions; and a gate clamp diode, comprising a diffusion in proximity to at least one of said source and drain; wherein the voltage of said gate controls current flow between said source and drain.

According to a disclosed class of innovative embodiments, there is provided: A transistor device, which includes: a plurality of semiconductor channel regions; a plurality of trenches each having a gate electrode therein; each said channel region connecting a source to a drain, and being bordered on two sides by ones of said trenches; each said channel region being electrically isolated at the bottom thereof; wherein some ones of said channel regions pinch off at different applied voltages than others of said channel regions.

According to a disclosed class of innovative embodiments, there is provided: A lateral transistor device, consisting essentially of: at least one first-conductivity-type channel region which is bordered on two sides by trenches each having a gate electrode therein, and which is electrically isolated at the bottom thereof, between said trenches, by a second-conductivity-type buried diffusion, and which runs between first-conductivity-type source and drain diffusions; and a gate clamp diode, comprising a second-conductivity-type diffusion in proximity to at least one of said source and drain; wherein the voltage of said gate controls current flow between said source and drain.

According to a disclosed class of innovative embodiments, there is provided: A method for depletion-mode transistor operation, comprising the actions of: routing current through at least one semiconductor channel region which is bordered on two sides by trenches each having a gate electrode therein, and which is electrically isolated at the bottom thereof, between said trenches, and which runs between a source and a drain; and applying voltage to said gate electrodes to pinch off said channel region when said transistor is to be turned off.

According to a disclosed class of innovative embodiments, there is provided: A method for depletion-mode transistor operation, comprising the actions of: routing current through at least one semiconductor channel region bordered on two sides by trenches each having a gate electrode therein, and electrically isolated at the bottom thereof, between said trenches; said channel region running between a source and a drain; and clamping the voltage excursion of said gate electrodes, using a gate clamp diode comprising a diffusion in proximity to at least one of said source and drain; and applying voltage to said gate electrodes to pinch off said channel region when said transistor is to be turned off.

According to a disclosed class of innovative embodiments, there is provided: A method for depletion-mode transistor operation, comprising the actions of: routing current through at least one semiconductor channel region which is bordered on two sides by trenches each having a gate electrode therein, and which is electrically isolated at the bottom thereof by a buried diffusion which extends from the bottoms of said trenches and is electrically continuous with said gate electrode, and which runs between first-conductivity-type source and drain diffusions; and clamping the voltage excursion of said gate electrodes, using a gate clamp diode comprising a diffusion in proximity to at least one of said source and drain; and applying voltage to said gate electrodes to pinch off said channel region when said transistor is to be turned off.

According to a disclosed class of innovative embodiments, there is provided: A method for depletion-mode transistor operation, comprising the actions of: routing current through a plurality of semiconductor channel regions connected in parallel; controlling current flow in said channel regions by applying a common voltage to a plurality of gate electrodes embedded in trenches, to controllably pinch off conduction in said channel regions; each said channel region connecting a source to a drain, and being bordered on two sides by ones of said trenches; wherein some ones of said channel regions pinch off at different applied voltages than others of said channel regions; whereby the non-simultaneous pinch-off of different channel regions softens the on/off transition when said gate electrodes are switched.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

For example, while p-channel depletion mode MOSFETs and JFETs have been discussed, n-channel depletion mode MOSFETs and JFETs can be obtained by reversing the conductivity types in the devices.

In embodiments which vary the pinch-off voltage of individual channels, the presently preferred embodiment varies the patterned width of channel fingers. Preferably a variation in the neighborhood of +/−25% is used, but optionally this patterned variation can be as small as +/−10%. (A few percent of in-wafer variation in minimum width is likely to occur from patterning artifacts anyway, but this class of embodiments teaches that more variation should be deliberately introduced into the patterning.) However, in alternative embodiments, a variety of other techniques can be used to vary the individual pinch-off voltages. For example, the sidewall dielectric thickness can be varied, and/or a varied degree of trench sidewall etchback can be performed, and/or a dopant source can be deposited into some but not all gate trenches, and/or a patterned deposition can be used to shift the work function of the sidewall gate material in some locations.

One contemplated application for the disclosed device structure is in transient blocking unit products, as described e.g. in U.S. Pat. No. 5,742,463, in US published application US2005128669, and in published PCT applications WO2005020402, WO2004034544, WO03069753, and WO2004006408; all of these are hereby incorporated by reference. Many other applications are also possible.

The claimed inventions are not limited to the geometries shown in the figures: as will be appreciated by those skilled in the art, a wide variety of other geometries can be implemented within the scope of the functional relations set forth above.

For another example, the semiconductor material can be silicon, or SiGe, or SiC, or various SiGeC alloys. The disclosed structures can also be adapted to GaAs, InP, GaN, other III-V binary or pseudo-binary semiconductor materials, or to other semiconductors to the extent the processes are available.

The starting wafer structure can be simple or epitaxial (as shown in the examples above), but can also include layered hybrids such as semiconductor-on-insulator, silicon-on-oxide, GaN-on-Si, GaN-on-sapphire, GaN-on-SiC, etc. etc.

For another example, the insulators used are not strictly limited to silicon dioxide, but can be oxynitrides or other process-compatible dielectric.

For another example, the conductive polysilicon material can alternatively (but less preferably) be replaced by another conductor with good conformal deposition characteristics, e.g. tungsten or a metal silicide.

For another example, other device types, beyond a simple FET, can optionally be constructed using the disclosed teachings.

The materials referred to herein, such as the materials used for conductors or capacitors, or the types of doping used in a material, are not intended to limit the scope of the present innovations. Other materials may be substituted for the examples given herein without deviating from the scope of the present innovations.

For another example, the structures described above can also be used with power devices which include graded bandgap or heterostructures.

For another example, the structures described above can also be used in combination with field plates, additional diffusions, or other known ways to modify potential gradients and on-resistance.

The disclosed device is particularly attractive for depletion-mode (normally-ON) operation. However, in alternative embodiments, the insulated-gate embodiments (e.g. those of FIGS. 1a, 1b, 2a, 2b, 3a, and 3b) can be configured for enhancement-mode operation.

In a further class of alternative embodiments, the drain side of the device can be modified to provide some degree of bipolar conduction. This can be done by causing some regeneration, i.e. some launch of minority carriers in proportion to the flow of majority carriers, e.g. by providing some area of n+ diffusion which (unlike the n+ clamp diode contact) is no farther from the channel region than the p+ drain diffusion is. (The polarities can of course be reversed for an NMOS device.)

Depending on what other high voltages and/or noise sources are present on the chip, it may be useful to surround the devices described above with an additional ring of isolation.

Additional general background, which helps to show variations and implementations, may be found e.g. in the following publications, all of which are hereby incorporated by reference: Smart Power ICs (ed. Murari 2002); Benda et al., Discrete and Integrated Power Semiconductor Devices (1999); Sueker, Power Electronics Design (2005); B. J. Baliga, Silicon RF Power MOSFETs (2005); B. J. Baliga, Power Semiconductor Devices (1995); and the proceedings of the annual conferences of the International Symposium on Power Semiconductor Devices and ICs (ISPSD) from 1988 to 2005.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A transistor device, which includes:
    at least one semiconductor channel region bordered on two sides by trenches each having a gate electrode therein, wherein said channel region comprises a first material of one conductivity type in a channel top portion and a second material of another said conductivity type in a channel bottom portion, wherein said channel is electrically isolated between said trenches; and
    said channel region runs between a source and a drain;
    wherein the voltage of said gate controls current flow between said source and drain.

2. The device of claim 1, wherein said channel region is wider, between said trenches, than another channel region.

3. The device of claim 1, wherein each said channel region has the same conductivity type from said top portion up to said bottom portion as said source and said dram.

4. The device of claim 1, wherein each said trench has essentially vertical sidewalls.

5. The device of claim 1, wherein each said gate electrode consists essentially of heavily doped polycrystalline silicon.

6. The device of claim 1, wherein said trenches are parallel.

7. The device of claim 1, wherein said channel region is electrically isolated at said bottom portion by diffusions which run continuously from beneath one of said trenches to beneath another of said trenches.

8. The device of claim 1, wherein said gate is insulated from said channel region.

9. The device of claim 1, wherein said gate is junction-isolated, but not insulated, from said channel region.

10. The device of claim 1, wherein said channel region is isolated by a uniform buried layer.

11. The device of claim 1, wherein said channel region is isolated by an underlying uniform insulator layer.

12. The device of claim 1, wherein said channel comprises a p-type material in said top channel region and an n-type material in said bottom channel region.

13. The device of claim 1, wherein said gate electrode fills said trenches and has a top surface that is wider than a length of said channel region and wider than a length of said trench.

14. The device of claim 1, wherein said trench is insulated along trench walls and a trench bottom.

15. The device of claim 1, wherein said trench is insulated alone trench walls.

16. A transistor device, which includes:
   at least one semiconductor channel region bordered on two sides by trenches each having a gate electrode therein, wherein said channel region comprises a first material of one conductivity type in a channel top portion and a second material of another said conductivity type in a channel bottom portion, wherein said channel is electrically isolated between said trenches;
   said channel region running between a source and a drain; and
   a clamp diode which limits the voltage difference between said gate and said source;
   wherein the voltage of said gate controls current flow between said source and said drain.

17. The device of claim 16, wherein some ones of said channel regions are wider, between said trenches, than others of said channel regions.

18. The device of claim 16, wherein each said channel region has the same conductivity type from said top portion up to said bottom portion as said source and said drain.

19. The device of claim 16, wherein each said trench has essentially vertical sidewalls.

20. The device of claim 16, wherein said channel region is electrically isolated at said bottom portion by diffusions which run continuously from beneath one of said trenches to beneath another of said trenches.

21. The device of claim 16, wherein said channel region is isolated by a uniform buried layer.

22. The device of claim 16, wherein said channel region is isolated by an underlying uniform insulator layer.

23. A lateral transistor device, comprising:
   a semiconductor channel region
      which is bordered on two sides by trenches each having a gate electrode therein,
      and which is electrically isolated at the bottom thereof by a buried diffusion which extends from the bottoms of said trenches,
      and which runs between first-conductivity-type source and drain diffusions; and
   a gate clamp diode, comprising a diffusion in proximity to at least one of said source and drain;
   wherein the voltage of said gate controls current flow between said source and drain.

24. The device of claim 23, wherein said channel region is wider, between said trenches, than another channel region.

25. The device of claim 23, wherein said channel region has the same conductivity type up to a bottom portion of said channel region as said source and said drain.

26. The device of claim 23, wherein said gate is insulated from said channel region.

27. The device of claim 16, wherein said channel comprises a p-type material in said top channel region and an n-type material in said bottom channel region.

28. The device of claim 16, wherein said gate electrode fills said wenches and has a top surface that is wider than a length of said channel region and wider than a length of said trench.

29. The device of claim 16, wherein said trench is insulated along trench walls and a trench bottom.

30. The device of claim 16, wherein said trench is insulated along trench walls.

* * * * *